(12) United States Patent
Su et al.

(10) Patent No.: US 7,948,732 B2
(45) Date of Patent: May 24, 2011

(54) ELECTROSTATIC DISCHARGE PROTECTION DEVICE AND AN ELECTRONIC DEVICE THEREOF

(75) Inventors: Chung-Yaw Su, Taipei Hsien (TW);
Yueh-Peng Hsiung, Taipei Hsien (TW);
Hsing-Kuang Chen, Taipei Hsien (TW);
Jen-Chieh Cheng, Taipei Hsien (TW);
Chun-Kang Li, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 371 days.

(21) Appl. No.: 12/213,405

(22) Filed: Jun. 19, 2008

(65) Prior Publication Data
US 2009/0027826 A1    Jan. 29, 2009

(30) Foreign Application Priority Data
Jul. 26, 2007    (TW) ............................... 96127182 A

(51) Int. Cl.
*H02H 1/00* (2006.01)
(52) U.S. Cl. ........................................ 361/220; 361/212

(58) Field of Classification Search ................... 361/56, 361/212, 220
See application file for complete search history.

(56) References Cited

U.S. PATENT DOCUMENTS
5,606,598 A * 2/1997 Karnowski et al. ............. 379/79
7,342,193 B2 * 3/2008 Chang et al. ................... 200/305

FOREIGN PATENT DOCUMENTS
JP    9-38302 A    2/1997
TW    293626    7/2006

* cited by examiner

*Primary Examiner* — Danny Nguyen
(74) *Attorney, Agent, or Firm* — Bacon & Thomas, PLLC

(57) ABSTRACT

An electrostatic discharge protection device is used to protect a component from electrostatic discharge in an electronic device. The electrostatic discharge protection device comprises a metal shell, a ground conductor, and a conductive material. The metal shell is used to cover the component. The ground conductor is used to directly connect the metal shell and a first grounded end. The conductive material is used to connect the ground conductor and a second grounded end in order to achieve double grounded effect.

12 Claims, 5 Drawing Sheets

ELECTROSTATIC DISCHARGE PROTECTION DEVICE AND AN ELECTRONIC DEVICE THEREOF

BACKGROUND OF THE INVENTION

1. Field of the Invention

The present invention relates to an electrostatic discharge protection device, and, more particularly, to an electrostatic discharge protection device having a metal shell.

2. Description of the Related Art

With the growth of technology, typical consumers prefer smaller portable electronic devices. However, these smaller electronic devices, with polymer materials, often suffer from electrical overstress (EOS) damage caused by electrostatic discharge (ESD). Therefore, an important issue concerns providing electrostatic discharge protection for these smaller electronic devices.

Please refer to FIG. 1A. FIG. 1A is a schematic drawing of a prior art electrostatic discharge protection device. A lid switch 94 is taken as an example; the lid switch 94 is electrically connected to an electronic device 90a via a signal wire 93a and a connection port 96a. The lid switch 94 is connected to a grounded end 921a via a ground wire 92a, which is used as an electrostatic discharge protection device. However, the lid switch 94 is made of a plastic material that is not a very good conductive material for static charge. Therefore, the lid switch 94 may collect a large amount of static charge and damage the electronic device 90a.

Please refer to FIG. 1B. FIG. 1B is a schematic drawing of another prior art electrostatic discharge protection device. A microphone 95 is taken by way of example. The microphone 95 is electrically connected to the electronic device 90b via the signal wire 93b and the connection port 96b. The microphone 95 utilizes a metal shell 91 to cover the microphone 95, and the microphone 95 uses the ground wire 92b to connect to a grounded end 921b for use as an electrostatic discharge protection device. However, the metal shell 91 is not directly connected to the grounded end 921b, and so static charge cannot be discharged. When the static charge cannot be discharged, a voltage arc may occur to the signal wire 93b of the microphone 95, which will cause damage to the microphone 95 or even short-circuit the electronic device 90b. In the prior art technology, a suppression component is added to the circuit of the ground wire 92b and the signal wire 93b to suppress the static electricity. However, the suppression component 97 does not provide very good performance and also increases manufacturing costs.

Therefore, it is desirable to provide an electrostatic discharge protection device to obviate the aforementioned problems.

SUMMARY OF THE INVENTION

A primary objective of the present invention is to provide an electrostatic discharge protection device.

In order to achieve the above-mentioned objective, an electrostatic discharge protection device is disposed in the electronic device and is used for protecting a component in the electronic device from electrostatic discharge. The electrostatic discharge protection device comprises a metal shell, a ground conductor and a conductive material. The metal shell is used for covering the surface of the component and is connected to the ground conductor to discharge any generated static charge through the ground conductor to a first grounded end. The conductive material is connected to the ground conductor and a second grounded end, which provides double grounded effect.

In an embodiment of the present invention, a component needs to be protected is a lid switch. The lid switch is covered by a metal shell. The metal shell and a ground conductor are electrically connected together, and another end of the ground conductor is grounded. With the above mentioned structure, the static charge on the lid switch can be discharged.

In another embodiment, a component needs to be protected is a microphone. The microphone is disposed in an electronic device. The body of the microphone is covered by a metal shell, and the metal shell is connected to a ground conductor to perform electrostatic discharge through the ground conductor to a first grounded end. The ground conductor can further have a conductive material. When the conductive material is connected to a second grounded end, which can provide double grounded effect.

Other objects, advantages, and novel features of the invention will become more apparent from the following detailed description when taken in conjunction with the accompanying drawings.

DETAILED DESCRIPTION OF THE PREFERRED EMBODIMENT

Figure 2:
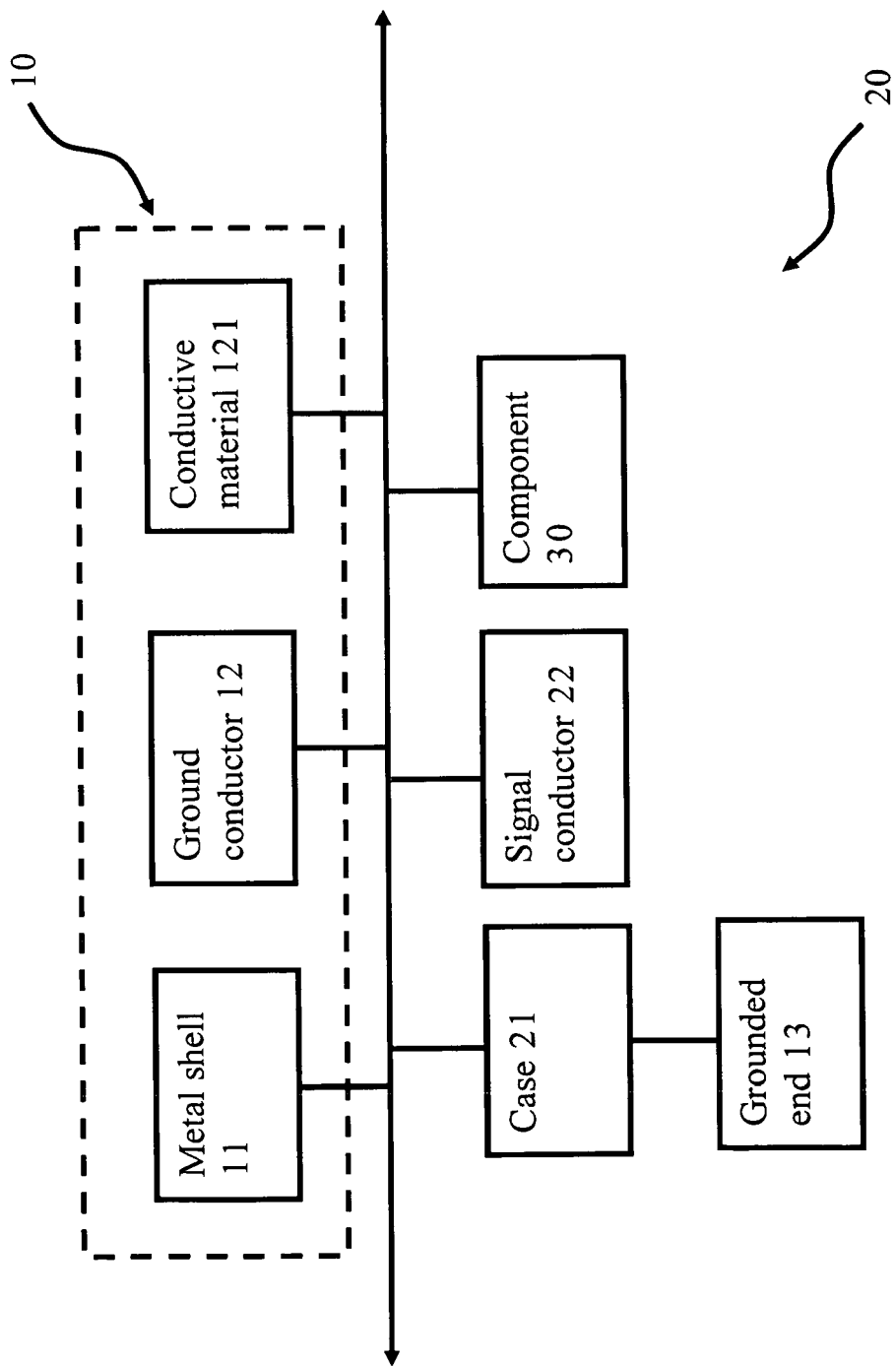
FIG. 2 is a structural drawing of an electrostatic discharge protection device and a related electronic device according to the present invention.

Please refer to FIG. 2. FIG. 2 is a structural drawing of an electrostatic discharge protection device and a related electronic device according to the present invention.

An electrostatic discharge protection device 10 of the present invention is disposed in an electronic device 20 and is used for protecting a component 30 in the electronic device 20 from electrostatic discharge (ESD). The electronic device 20 can be a notebook computer or any other various device. The electronic device 20 comprises a case 21 and an internal component 30, and the component 30 utilizes a signal conductor 22, such as a wire, to transmit signals. The electrostatic discharge protection device 10 comprises a metal shell 11, a ground conductor 12, such as a wire, and a conductive material 121. The metal shell 11 is used for covering the surface of the component 30 and is connected to the ground conductor 12 to conduct any generated static charge through the ground conductor 12 to a grounded end 13. The grounded end 13 can be the case 21 of the electronic device 20 or another design. The conductive material 121 is made of metallic material. The conductive material 121 is used for simultaneously connecting to the ground conductor 12 and the grounded end 13, which electrostatic discharging may be performed with better results. A more detailed description of the electrostatic discharge protection device 10 will be provided later.

Figure 3:
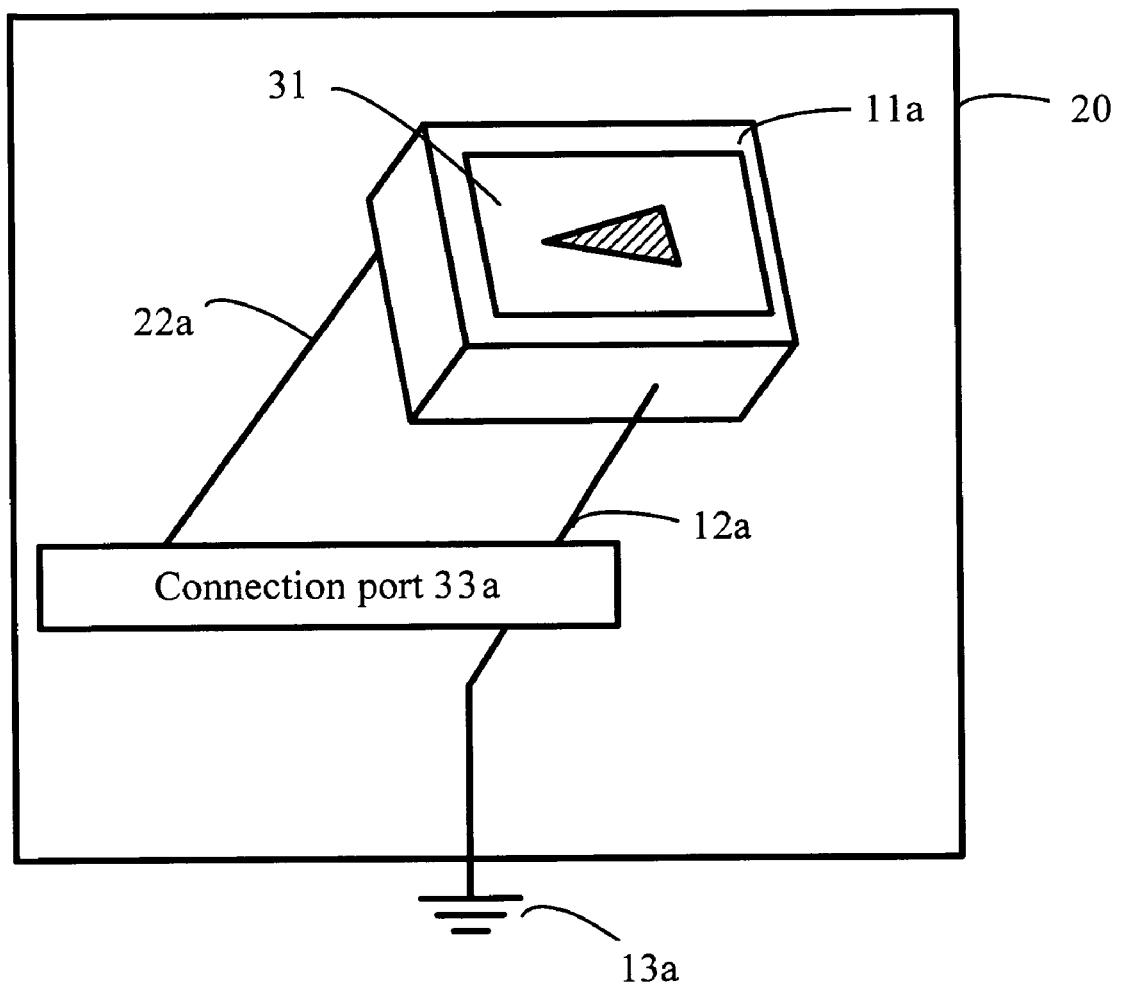
FIG. 3 is a schematic drawing of a first embodiment of an electrostatic discharge protection device according to the present invention.

Please refer to FIG. 3. FIG. 3 is a schematic drawing of a first embodiment of the electrostatic discharge protection device according to the present invention.

In a first embodiment, the component 30 of the electronic device 20 is a lid switch 31. The lid switch 31 may be a mechanical switch. The lid switch 31 is usually disposed on a panel of the electronic device 20, and another device, such as a corresponding mechanism (not shown), on a screen of the notebook computer is used to press the lid switch 31 to control the electronic device 20. The body of the lid switch 31 is made of a plastic material covered by a metal shell 11a. The lid switch 31 and a connection port 33a are electrically connected to each other. The connection port 33a is used for connecting together the lid switch 31 and the electronic device 20, so the lid switch 31 can utilize a signal conductor 22a and the connection port 33a to control the electronic device 20. The metal shell 11a is electrically connected to one end of a ground conductor 12a, and another end of the ground conductor 12a is connected to a grounded end 13a. With the electrical connection between the metal shell 11a and the ground conductor 12a, electrostatic discharge generated by the lid switch 31 can be discharged.

Figure 4:
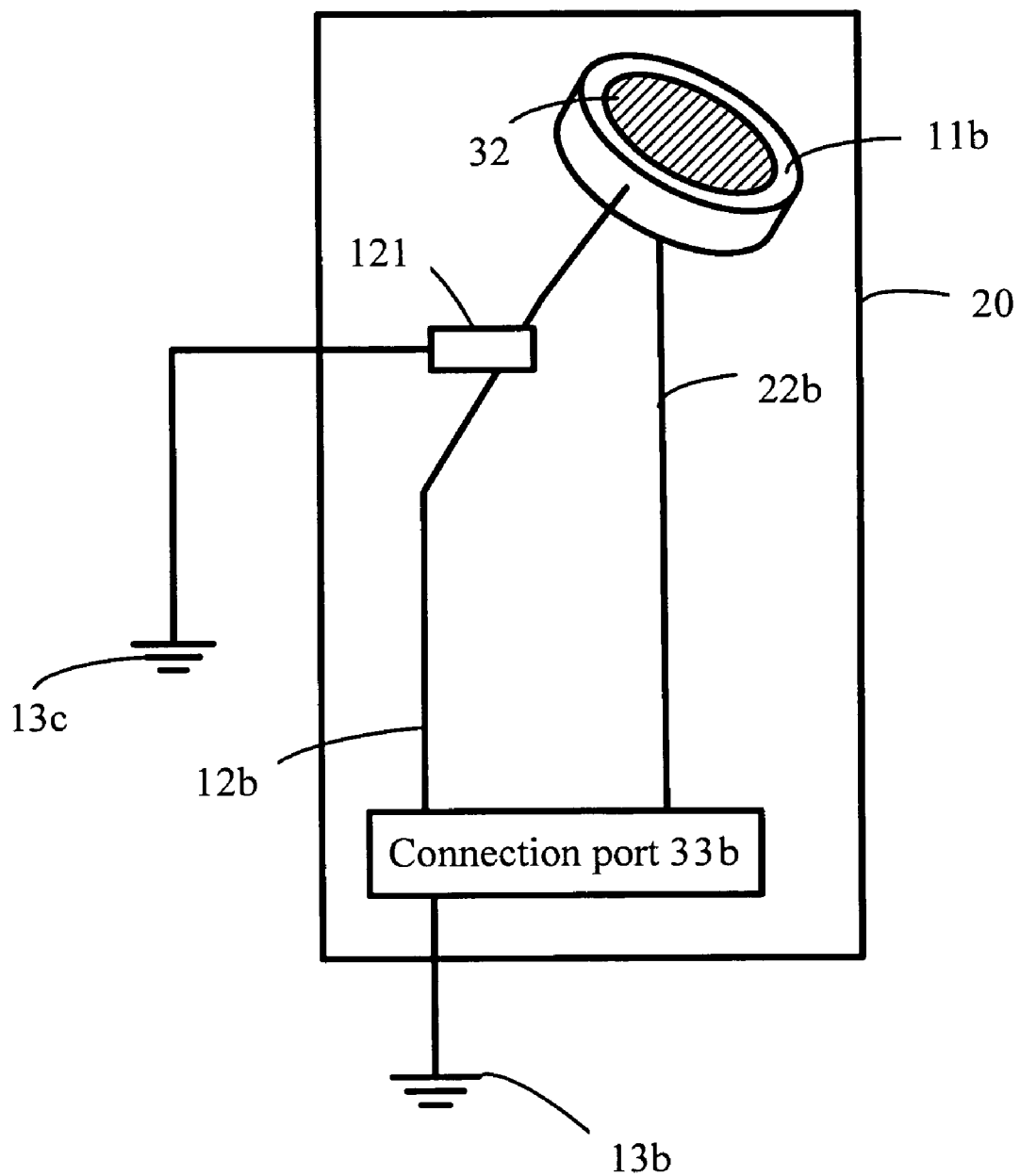
FIG. 4 is a schematic drawing of a second embodiment of an electrostatic discharge protection device according to the present invention.

The electrostatic discharge protection device 10 of the present invention may have other structures. Please refer to FIG. 4 for another structure. FIG. 4 is a schematic drawing of a second embodiment of the electrostatic discharge protection device according to the present invention.

In a second embodiment, the component 30 of the electronic device 20 is a microphone 32. The microphone 32 is disposed in the electronic device 20. The microphone 32 utilizes a signal conductor 22b to connect to a connection port 33b and to the electronic device 20. The body of the microphone 32 is covered by a metal shell 11b, and the metal shell 11b is connected to a ground conductor 12b to conduct any generated static charge through the ground conductor 12b to a first grounded end 13b.

Figure 1A:
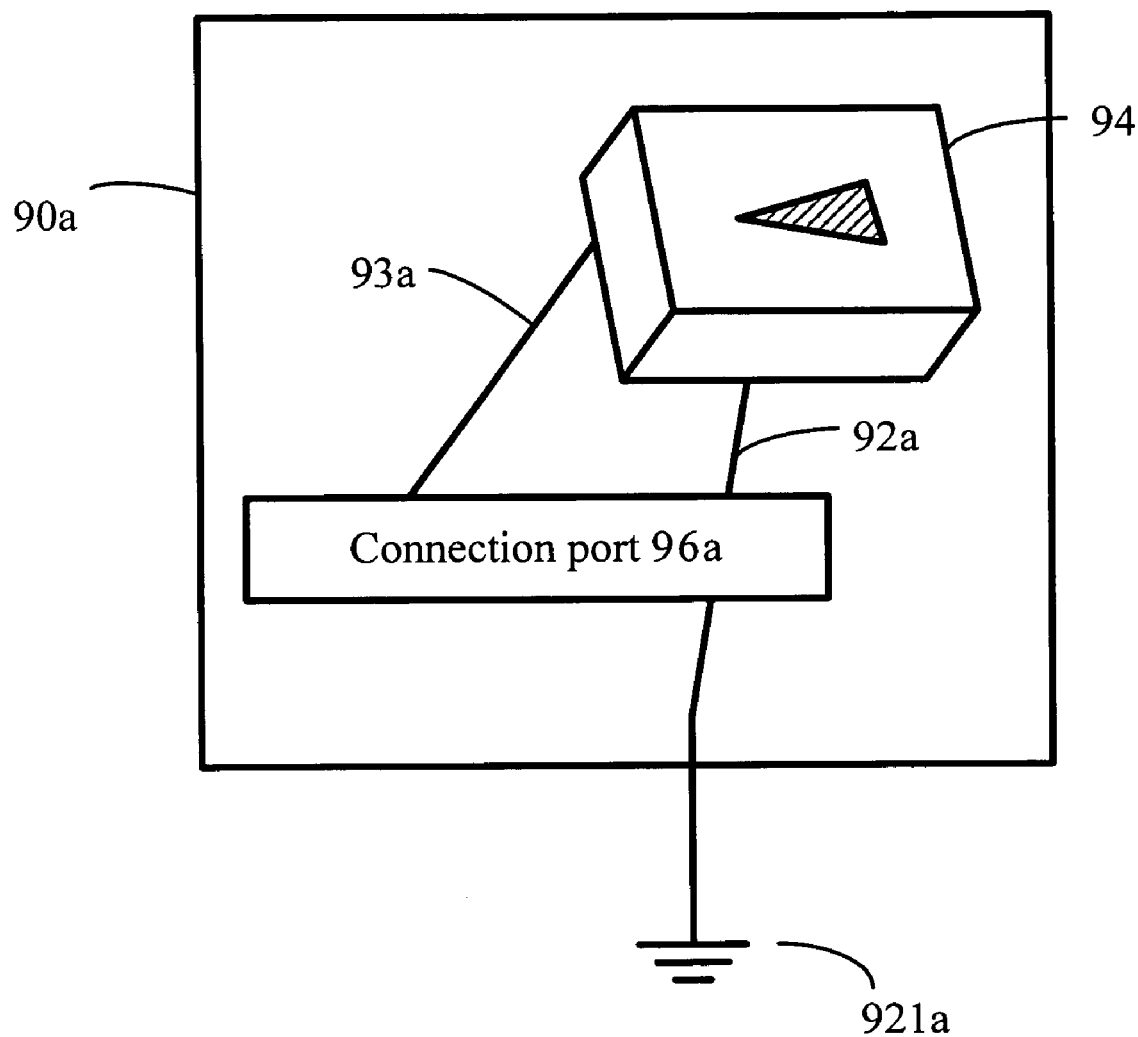
FIG. 1A is a schematic drawing of a prior art electrostatic discharge protection device.
Figure 1B:
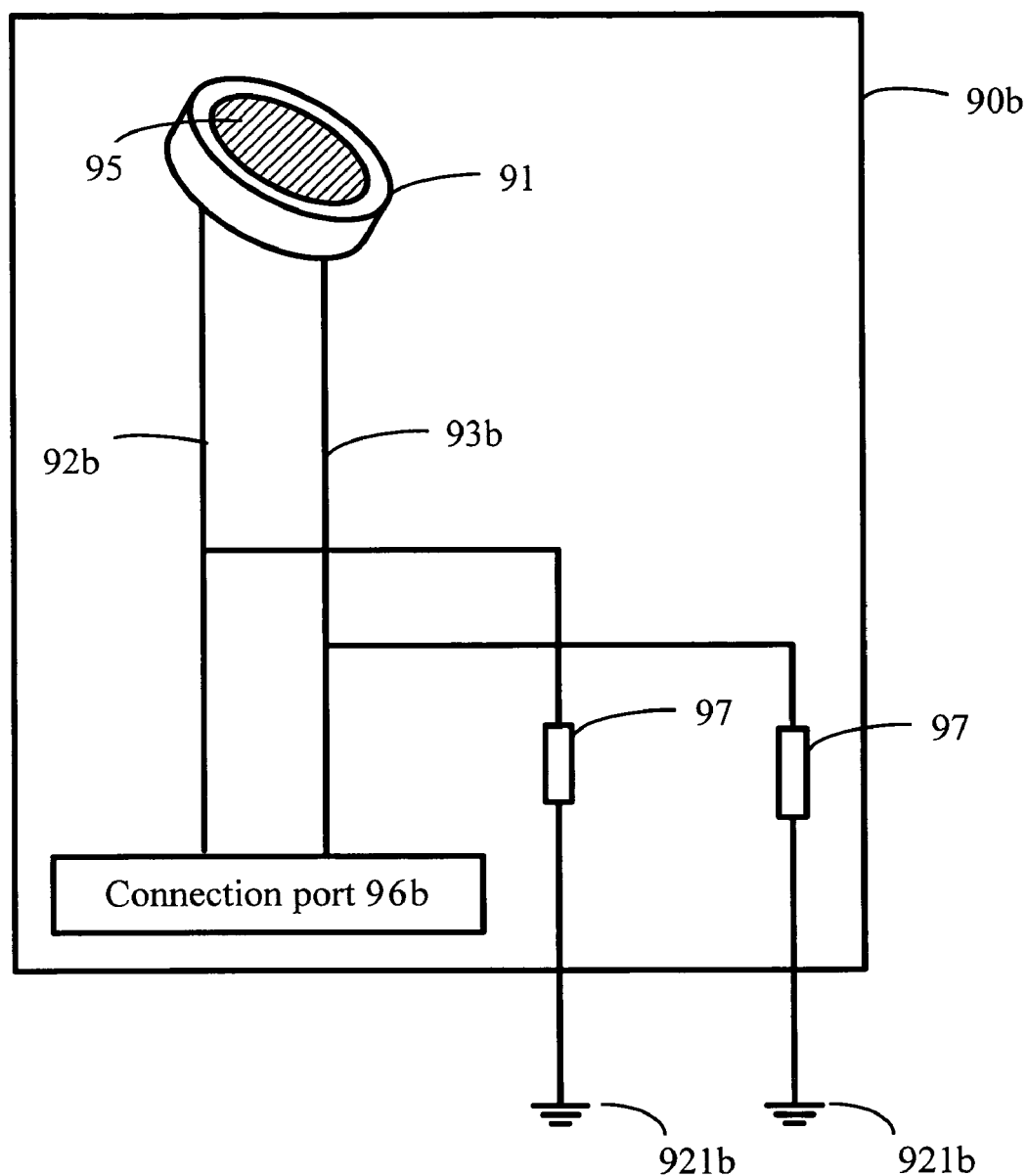
FIG. 1B is a schematic drawing of another prior art electrostatic discharge protection device.

If a connection length between the ground conductor 12b and the first grounded end 13b is too long, the ground conductor 12b can be connected to a conductive material 121. In other words, a portion of the insulation wrapping on the ground conductor 12b may be removed, the exposed portion can be connected to the conductive material 121, and the conductive material 121 may be directly connected to a second grounded end 13c nearby. The conductive material 121 is preferably disposed on the ground conductor 12b close to the microphone 32, which means the distance from the conductive material 121 to the microphone 32 is less than the distance between the conductive material 121 and the first grounded end 13b. Furthermore, the distance between the microphone 32 and the second grounded end 13c is less than the distance between the microphone 32 and the first grounded end 13b. Therefore, the microphone 32 can achieve double grounded effect via the second grounded end 13c nearby. Moreover, in this embodiment, the first grounded end 13b and the second grounded end 13c are both part of the case 21 of the electronic device 20 shown in FIG. 1, but the present invention may have other designs. In addition, several conductive materials 121 may be used in the electrostatic discharge protection device 10, and these multiple conductive materials 121 can be separately grounded to provide double grounded or triple grounded effects. As a result, electrostatic discharging may be performed with better results.

Although the present invention has been explained in relation to its preferred embodiment, it is to be understood that many other possible modifications and variations can be made without departing from the spirit and scope of the invention as hereinafter claimed.

What is claimed is:

1. An electrostatic discharge protection device for protecting a microphone from electrostatic discharge, the microphone disposed in an electronic device, the electrostatic discharge protection device comprising:
a metal shell for covering the microphone;
a ground conductor connected to the metal shell and to a first grounded end; and
a conductive material electrically connected to the ground conductor and directly connected to a second grounded end.

2. The electrostatic discharge protection device as claimed in claim 1 wherein the conductive material is made of a metallic material.

3. The electrostatic discharge protection device as claimed in claim 1 wherein a distance between the conductive material and the microphone is less than a distance between the conductive material and the first grounded end.

4. The electrostatic discharge protection device as claimed in claim 1 wherein a distance between the microphone and second grounded end is less than a distance between the microphone and the first grounded end.

5. The electrostatic discharge protection device as claimed in claim 1 wherein the first grounded end and the second grounded end are a case of the electronic device.

6. An electronic device comprising:
a component; and
an electrostatic discharge protection device used for protecting the component from electrostatic discharge, the electrostatic discharge protection device comprising:
a metal shell for covering the component;
a ground conductor directly connected to the metal shell and to a first grounded end; and
a conductive material electrically connected to the ground conductor and further connected to a second grounded end.

7. The electronic device as claimed in claim 6, wherein a distance between the conductive material and the component is less than a distance between the conductive material and the first grounded end.

8. The electronic device as claimed in claim 6, wherein a distance between the component and the second grounded end is less than a distance between the component and the first grounded end.

9. The electronic device as claimed in claim 6, wherein the first grounded end and the second grounded end are a case of the electronic device.

10. The electronic device as claimed in claim 6, wherein the conductive material is made of a metallic material.

11. The electronic device as claimed in claim 6, wherein the component is a microphone.

12. The electronic device as claimed in claim 6, wherein the component is a panel switch device.

\* \* \* \* \*